(12) United States Patent
Loebl et al.

(10) Patent No.: US 9,515,288 B2
(45) Date of Patent: Dec. 6, 2016

(54) ORGANIC ELECTROLUMINESCENT DEVICE

(71) Applicant: KONINKLIJKE PHILIPS N.V., Eindhoven (NL)

(72) Inventors: Hans-Peter Loebl, Monschau-Imgenbroich (DE); Jens Meyer, Aachen (DE); Claudia Michaela Goldmann, Merzenich (DE)

(73) Assignee: Koninklijke Philips N.V., Eindhoven (NL)

( * ) Notice: Subject to any disclaimer, the term of this patent is extended or adjusted under 35 U.S.C. 154(b) by 55 days.

(21) Appl. No.: 14/408,997

(22) PCT Filed: Jun. 11, 2013

(86) PCT No.: PCT/IB2013/054771
§ 371 (c)(1),
(2) Date: Dec. 18, 2014

(87) PCT Pub. No.: WO2013/190427
PCT Pub. Date: Dec. 27, 2013

(65) Prior Publication Data
US 2015/0357596 A1    Dec. 10, 2015

Related U.S. Application Data

(60) Provisional application No. 61/661,457, filed on Jun. 19, 2012.

(51) Int. Cl.
*H01L 51/52* (2006.01)
*H01L 51/50* (2006.01)
(Continued)

(52) U.S. Cl.
CPC ............. *H01L 51/5253* (2013.01); *H01B 1/04* (2013.01); *H01L 51/50* (2013.01);
(Continued)

(58) Field of Classification Search
CPC .. H01L 51/5253; H01L 51/5044; H01L 51/56; H01L 51/5278; H01L 51/50; H05B 33/28; H01B 1/04; H01B 51/5056; H01B 51/5072
See application file for complete search history.

(56) References Cited

U.S. PATENT DOCUMENTS

2009/0071533 A1\* 3/2009 Choi ............... H01L 31/022466
136/252
2010/0288362 A1   11/2010 Hatwar et al.
(Continued)

FOREIGN PATENT DOCUMENTS

DE    102008039756 A1    2/2010
EP    2439779 A2    4/2012
(Continued)

OTHER PUBLICATIONS

Sukang Bae et al; "Roll-To-Roll Production of 30-Inch Graphene Films for Transparent Electrodes", Nature Nanotechnology, vol. 5, Aug. 2010, pp. 574-578.
(Continued)

*Primary Examiner* — John P Dulka

(57) ABSTRACT

The invention relates to the field of organic electronic devices (1) with diffusion barriers and to a method to manufacture such organic electronic devices (1) to provide an organic electronic device (1) with excellent performance, which is as stable as possible over time. The organic electronic device (1) with a substrate (2), a first electrode (3) arranged on top of the substrate (2) and a functional layer stack (FLS) arranged on top of the first electrode (3) comprising one or more organic layers (41, 42, 43) and a second electrode (5), wherein the organic electronic device (1) further comprises at least one essentially transparent and electrically conductive graphene layer (6) arranged in contact to at least one of the organic layers (41, 42, 43) acting
(Continued)

as a diffusion barrier against diffusion of atoms, ions or molecules into this organic layer (41, 42, 43).

14 Claims, 5 Drawing Sheets

(51) Int. Cl.
 *H01L 51/56* (2006.01)
 *H01B 1/04* (2006.01)
 *H05B 33/28* (2006.01)

(52) U.S. Cl.
 CPC ...... *H01L 51/5044* (2013.01); *H01L 51/5278* (2013.01); *H01L 51/56* (2013.01); *H05B 33/28* (2013.01); *H01L 51/5056* (2013.01); *H01L 51/5072* (2013.01)

(56) References Cited

U.S. PATENT DOCUMENTS

| 2011/0088931 | A1 | 4/2011 | Lettow et al. |
| 2011/0091647 | A1 | 4/2011 | Colombo et al. |
| 2011/0300338 | A1 | 12/2011 | Shin et al. |
| 2012/0141799 | A1* | 6/2012 | Kub ............... B82Y 30/00 428/408 |

FOREIGN PATENT DOCUMENTS

| WO | 2009123771 A2 | 10/2009 |
| WO | 2011046655 A2 | 4/2011 |

OTHER PUBLICATIONS

J. Scott Bunch et al; "Impermeable Atomic Membranes From Graphene Sheets", Nano Letters, vol. 8, No. 8, pp. 2458-2462, May 21, 2008, Cornell Univ, Ithaca, NY.

Junbo Wu et al; "Organic Light-Emitting Diodes on Solution-Processed Graphene Transparent Electrodes", Acsnano, vol. 30, No. 20, pp. B-F, Nov. 5, 2009.

Yu-Ying Lee et al; "Top Laminated Graphene Electrode in a Semitransparent Polymer Solar Cell by Simultaneous Thermal Annealing/Releasing Method", Acsnano, vol. 5, No. 8, pp. 6564-6570, Jul. 12, 2011.

* cited by examiner

ORGANIC ELECTROLUMINESCENT DEVICE

CROSS-REFERENCE TO PRIOR APPLICATIONS

This application is the U.S. National Phase application under 35 U.S.C. §371 of International Application No. PCT/IB13/054771, filed on Jun. 11, 2013, which claims the benefit of U.S. Provisional Patent Application No. 61/661,457, filed on Jun. 19, 2012. These applications are hereby incorporated by reference herein.

FIELD OF THE INVENTION

The invention relates to the field of organic electroluminescent devices with diffusion barriers and to a method to manufacture such OLEDs.

BACKGROUND OF THE INVENTION

Organic electronic devices such as organic photovoltaic devices or organic light emitting devices (OLED) are comprised of several functional layers in which the hole-transport and electron-transport layers are often p-doped and n-doped, respectively, to improve the charge injection properties from the electrodes and to lower resistivity losses for an overall enhanced device performance. These organic electronic devices have a large variety of different organic layer structures. As an example, white light emitting OLEDs may have a light emitting layer with multiple different light-emitting molecules to generate white light emission from this single layer, a stack of multiple light-emitting layers each emitting a different color of light or light emitting units each comprising at least one light-emitting layer sandwiched between additional functional layers, where two or more of these units are arranged on top of each other (stacked units) in order to emit white light as a stacked OLED. Doped organic layers are also frequently used in stacked OLEDs to form a serial connection between multiple emitting units providing the technology to realize efficient white OLEDs at high brightness levels and long lifetimes.

US 2010/0288362 A1 discloses an organic electronic device with improved performance, which could be used as a solar cell or as a stacked organic light emitting device.

To provide OLEDs delivering stable performance over time the doping conditions (doping concentration) in the organic layers must be stable over time to guarantee best performance even after several hundreds of operating hours. Since the operation of organic electronic devices caused elevated temperatures of up to 100° C. during operation and for special applications operation at elevated temperatures even slightly above 100° C. is required, the organic layers and its composition must be stable at elevated temperatures. Furthermore the organic layers must be stable when exposed to light, especially UV light. There is a demand for providing such an organic electronic device showing an excellent performance, which is as stable as possible over time.

SUMMARY OF THE INVENTION

It is an object of the invention to provide an organic electronic device with excellent performance, which is as stable as possible over time.

This object is achieved by an organic electronic device with a substrate, a first electrode arranged on top of the substrate and a functional layer stack arranged on top of the first electrode comprising one or more organic layers and a second electrode, wherein the organic electronic device further comprises at least one essentially transparent and electrically conductive graphene layer arranged in contact to at least one of the organic layers acting as a diffusion barrier against diffusion of atoms, ions or molecules into or from this organic layer. Possible applications of the organic electronic device might be a photovoltaic cell or an organic light emitting device. The substrate carries all the layers deposited on top of the substrate. The term "first electrode on top of the substrate" covers the following possibilities of (a) the first electrode is arranged directly on top of the substrate or (b) there are additional layers arranged between first electrode and substrate. The first and second electrode layers are made of electrically conductive material, e.g. in order to be able to apply an operating voltage to the part of the layers of the functional layer stack arranged between first and second electrode. The first and second electrodes arranged as a layer are anode and cathode or vice versa depending on the desired application and the arrangement of the organic layers within the functional layer stack. The organic layers of the functional layer stack might be arranged all between the first and second electrode or there might be one or more organic layers arranged on top of the second electrode on the side of the functional layer stack facing away from the substrate. The functional layer stack denotes the layers contributing to the performance of the organic electronic device, when being operated. The properties of the organic layers, e.g. the initial composition, are optimized to provide best performance. Since diffusion effects, especially in case of doped layers, lead to a change of the initial composition and thus to a degradation of the functional properties of the organic layer, a diffusion of atoms, ions or molecules from one organic layer into the adjacent organic layer or from the electrodes into the organic layer stack should be prevented as effectively as possible. Graphene consists of $sp^2$ bonded carbon arranged in a two dimensional crystal. The high electron density of its aromatic rings provides sufficient electromagnetic force to repel atoms, ions and molecules from passing through these aromatic rings. A corresponding layer made of graphene will therefore provide a diffusion barrier to atoms, ions and molecules which at least strongly hampers atoms, ions and molecules from passing the graphene layer. Therefore organic layers can be protected against diffusion through the graphene layer. The degree of diffusion prevention depends on the composition and structure of the graphene layer. A graphene compound layer comprising graphene structure with limited size embedded in a binder matrix comprises a number of diffusion channels through the binder matrix around the embedded graphene structures. The suppression of diffusion will increase with increased amount of graphene structures inside the graphene compound layer of the same layer thickness. However, the diffusion barrier is more effective in case of graphene layers made of several layers of two dimensional crystal of $sp^2$ bonded carbon. The most preferred diffusion barrier is achieved with a single layer of $sp^2$ bonded carbon arranged in a two dimensional crystal. As an example, the previously described graphene layers will effectively hamper or even prevent the diffusion of molecular n-type dopants and p-type dopants. The same holds for gas and moisture, which are critical substances for the performance of organic electronic devices. The organic electronic device might be any device, where a voltage is applied to the electrodes acting as anode and cathode as the operational voltage of the organic electronic device, e.g. in an organic light emitting device, or a current can be drawn from the anode and cathode as the electrodes, e.g. in a photovoltaic cell. The first and second electrodes might be made of metals such as Al in case of non-transparent electrodes or might be made of indium-tin-oxide (ITO) in case of transparent electrodes.

The term "essentially transparent" denotes layers, which have a transparency larger than 40%, preferably larger than 60% at least within the spectrum ranging from 470 nm to 620 nm wavelength in a direction perpendicular to the layer surface. A layer is denoted as being electrically conductive as long as the layer does not lead to a significant increase of the overall resistance of the organic layer stack comprising the graphene layer as measured between the electrodes compared to the measured value for the same organic layer stack without any graphene layer.

In an embodiment the organic electronic device is an organic light emitting device comprising at least one organic light emitting layer within an organic layer stack of the functional layer stack arranged between the first and second electrodes. The organic light emitting device may utilize organic small molecules or polymers to produce light. Accordingly, OLEDs may be referred to as small molecule organic light emitting devices (SMOLEDs) or polymer light emitting devices (PLEDs). However, SMOLEDs are preferred because of their better light emission performance. The substrate might be made of a transparent material, e.g. glass or plastic, having two essentially parallel surfaces, especially when the light shall be emitted through the substrate. The side of the substrate facing towards the functional layer stack is also denoted as the backside of the substrate. The side of the substrate opposite to the back side is denoted as light emitting side. The term "organic layer stack" denotes the organic layers arranged between first and second electrode being anode and cathode to provide the operational voltage to the OLED. The organic layer stack may comprise a plurality of organic layers arranged between the electrodes (anode and cathode), such as hole transport layers, electron transport layers, hole blocking layers, electron blocking layers, one or more light emitting layers, e.g. comprising a host material with embedded light emitting molecules. A large number of different organic layer stacks comprising a different number/type of layers is known to skilled people, which are able to choose a suitable organic layer stack in dependence on the desired application. Typically, the electrode deposited on top of the substrate (first electrode) is a transparent anode, e.g. made of indium-tin-oxide (ITO). The second electrode, typically the cathode, is made of a reflective metal, e.g. Al. In an embodiment, the ITO-anode is sputtered while the organic layer stack and the second electrode (Al- or Ag-cathode) are evaporated to prepare the organic light emitting device. In some embodiment, there are additional layers present between the transparent anode and the substrate in order to improve the light out-coupling behavior of the OLED. The functional layer stack may comprise in addition to the organic layer stack one or more organic layers arranged on top of the second electrode acting as organic index matching layer to adapt the optical properties of the functional layer stack such as refractive index and reflectivity in order to enhance the light out-coupling out of the OLED.

The OLED may further comprise a cover lid sealed to the substrate in order to establish an encapsulation around the functional layer stack to prevent the moisture or oxygen penetrating to the organic layers within the functional layer stack. A suitable sealing material to provide a gastight seal is glass frit. The material of the cover lid might be metal, ceramic material or glass. The cover lid and the seal are not part of the functional layer stack. Alternatively to a cover lid the functional layer stack might be covered by a thin film encapsulation.

Here, the graphene layer might be arranged at any suitable location within the functional layer stack. The graphene layer might be arranged between the anode and the first organic layer, e.g. a hole transport layer, in order to prevent diffusion from the anode material, e.g. In-ions or atoms case of an ITO anode, or from the substrate into the first organic layer. Alternatively or in addition to the graphene layer between anode and first organic layer, a graphene layer might be arranged between the topmost organic layer of the organic layer stack and the cathode minimizing or preventing the diffusion of metal atoms or ions such as Au, Ag, Al or In into the topmost organic layer. Metal atoms or ions diffusing from the electrodes into the organic layer stack can strongly disturb the performance of the organic light emitting device, especially over lifetime. In another embodiment the graphene layer might be arranged as the outermost layer of the functional layer stack on top of the organic index matching layer to prevent atoms, ions or molecules diffusing into the functional layer stack from the environment. Preferably the graphene layer covers the functional layer stack.

In an embodiment at least one of the graphene layers is arranged between two organic layers within the organic layer stack. The organic layer stack may comprise only one graphene layer, which is arranged between two organic layers or in case of more than one graphene layers present between the first and second electrode, one of the graphene layers is arranged between two organic layers. In case of an organic layer stack comprising more than two organic layers, there might be two or more graphene layers arranged between different organic layers. To improve the performance of organic light emitting devices, several organic layers are doped with suitable dopants, which are intrinsic sources of diffusion processes, since adjacent layers are doped differently. The present composition gradient of the dopants near the interface between differently doped organic layers leads to diffusion effects in case of no diffusion barrier present between the doped organic layers. The graphene in between differently doped organic layer will strongly reduce or even prevent diffusion through the graphene layer in between. The differently doped adjacent organic layers might be layers, where one layer is not doped and the other organic layer is doped with a dopant at a specific concentration. Or the differently doped layers are both doped layers, where one organic layer is doped with a first dopant and the other organic layer is doped with a second dopant different from the first dopant.

In an embodiment the organic layer stack of the organic light emitting device comprises at least two light emitting units between the first and second electrode, wherein each light emitting unit comprises one unit layer stack with at least one organic light emitting layer, wherein at least two of the light emitting units are separated from each other by a charge generation layer stack comprising an organic p-doped layer and an organic n-doped layer and the graphene layer between the p-doped layer and the n-doped layer. The dopants might be organic or inorganic material such as Cs with a high risk of diffusion. For example stacked OLEDs are capable to provide white light with a desired color rendering due to the mixture of light emitted from different organic light emitting layers of different stacked light emitting units, where the organic layer stack of each light emitting unit (=unit layer stack) is mostly optimized to provide best performance. Due to the separated organic light emitting layers, the emitting molecules providing the desired emission wavelength can be selected for each light emitting unit in order to provide e.g. white light with a certain color rendering index. White light emitted from a stacked organic light emitting device might be a mixture of red, green and blue light emitted from a first, second and third light emitting unit comprising a red-emitting, green-emitting and blue-emitting organic light emitting layer, respectively. The organic layer stack of a stacked OLED comprises a large number of organic layers. In order to be able to operate the stacked OLED with a low driving voltage, so-called charge generation layers are introduced to separate the light emitting units from each other and to provide the required amount of electrons and holes close to the light emitting layer to achieve a high luminance. The charge generation layer comprises an organic n-type layer and an organic p-type layer forming a p-n hetero-interface leading to a band bending at the interface so that electrons can easily tunnel from the highest occupied molecular orbit (HOMO) level of the p-doped material to the lowest unoccupied molecular orbit (LUMO) level of the n-doped layer through a narrow depletion region at the interface leaving a hole in the HOMO of the p-doped layer. This electron-hole pair is at the origin of the charge generation process. The generated hole and electron then separate and move towards the organic light emitting layers under the applied electrical field across the organic layer stack between first and second electrode, where each of them forms an exciton with their counterpart. Without the graphene layer in between the n-type and p-type doped organic layers, the diffusion process of p-type dopants diffusing into the n-type doped organic layer and vice versa leads to the formation of a depletion region reducing the tunneling ratio until no tunneling will further occur. When the tunneling ratio is strongly reduced, the former charge generation layer stack will not be able to act as a charge generation layer stack anymore and the performance of the stacked OLED will strongly degrade. The graphene layer in between the p-type and n-type doped organic layers will strongly reduce or even prevent diffusion of n-type dopants into the p-type doped organic layer and vice versa. This results in a stable charge generation process and therefore in a stable performance of the stacked OLED over time. Furthermore due to the separation of p-type and n-type dopants, the depletion region at the interface between p-type and n-type doped organic layers will remain small leading to a low operation voltage, which remains stable at a low level over time. Since the graphene layer will not change its crystal structure under common operation temperatures of stacked OLED devices, typically up to 100° C. or for special application even slightly above 100° C., the performance is stable even at elevated temperatures. The same holds for OLEDs exposure to light, since the crystal structure of graphene is stable when exposed to visible or UV light. In an embodiment the organic layer stack of the organic light emitting device comprises three light emitting units between the first and second electrodes, wherein each of the three light emitting units comprises one unit layer stack with at least one organic light emitting layer, wherein the three light emitting units are separated from each other by the charge generation layer stacks. The electrical properties of the graphene layer maintain the good electrical contact between the light emitting units within the organic layer stack. In an embodiment the charge generation layer may comprise additional layers to the previously mentioned layers. In an embodiment the charge generation layer stack is a layer stack only consisting of the layer sequence: organic p-doped layer, graphene layer, organic n-doped layer.

In an embodiment the n-doped layer comprises an electron transport material suitable to provide an electron transport layer and a n-type dopant, where the ionization energy of the n-type dopant is lower or equal to the electron affinity of the electron transport material. For practical applications, the ionization energy of the dopant should not be too low to guarantee handling in air or in moisture and oxygen containing atmosphere. An example for such a n-doped system is Net18 doped with NDN26 from Novaled. A typical doping concentration is 10%. The thickness of the n-doped organic layer ranges between 10 nm and 200 nm.

In an embodiment the p-doped layer comprises a hole transport material suitable to provide a hole transport layer and a p-type dopant, where the ionization energy of the hole transport material is lower or equal to the electron affinity of the p-type dopant. Typical p-type dopants are for example NDP9 from Novaled, $F_4$-TCNQ or $MoO_3$. For a sufficient band bending of the p-doped organic layer at the interface to the n-doped organic layer, the thickness of the p-doped organic layer should be at least 10 nm. Suitable hole transport materials are α-NPD or MTDATA.

In an embodiment at least one of the graphene layers provides an intermediate electrode within the organic layer stack in addition to the first and second electrode also connected to a power source. This enables to provide a bias voltage to the organic layer stack via the intermediate electrode in addition to the overall operating voltage applied to first and second electrodes. The bias voltage enables a fine tuning of the emission properties of the light emitting units independently from each other. With such bias voltage, the overall color of the light emitted from the stacked OLED can be varied on demand.

In an embodiment the composition and layer thickness of the graphene layer are adapted to provide a transparency of the graphene layer of at least 95% within the visible spectrum between 470 nm and 620 nm. The high transparency of the graphene layer allows arranging more than one graphene layer within the organic layer stack without reducing the brightness of the organic light emitting devices.

In an embodiment the graphene layer is established by multiple single layers of $sp^2$ bonded carbon arranged in a two dimensional crystal with a total layer thickness below 2 nm. This graphene layer will provide an improved diffusion barrier compared to graphene compound layer, because the diffusion channels provided by matrix filler material (binder) are avoided. This graphene layer is made of several layers of two dimensional crystal of $sp^2$ bonded carbon in direct contact on top of each other. The total thickness of the graphene layers is adapted to provide a good diffusion barrier while maintaining a required transparency. Therefore the thickness of the graphene layer should not exceed 5 nm, preferably not more than 2 nm.

In another embodiment the graphene layer is a single layer of $sp^2$ bonded carbon arranged in a two dimensional crystal. An at least widely undisturbed graphene layer will provide at least a nearly ideal diffusion barrier even preventing the diffusion of small molecules such as helium at least in the undisturbed regions of the two dimensional crystal. Such a layer exhibits a very high in-plane mobility of charge carriers of more than 20000 $cm^2/Vs$, a ballistic charge transport and a high transparency of more than 95%.

In an embodiment the graphene layer is arranged on top of each organic layer within the organic layer stack. In this embodiment, all organic layers are protected against undesired diffusion of atoms, ions or molecules while maintaining the required electrical properties of the functional layer stack.

The graphene layer can be grown by catalyst-assisted vapor deposition (CVD), a method as disclosed in US 20110091647 A1. The method has been demonstrated to produce scalable high quality graphene sheets. Thereby, graphene is grown on a catalyst such as Cu, and then a polymer is applied on top of the graphene surface as support. Subsequently the metal catalyst is etched away and the released graphene is transferred onto a target substrate. Finally, the polymer support is removed.

The invention further relates to a method to manufacture an organic electronic device as claimed in the present invention, where the graphene layer is introduced into the functional layer stack by transferring the graphene layer from a provisional polymer support to the surface of one of the layers within the functional layer stack followed by removing the polymere support with a suitable removing process. As an example the polymer support can be finally removed by a temperature release, evaporation of the polymer, chemical etching, chemical dissolving or plasma etching. The term "polymere support" denotes any material suitable to carry the graphene layer for an intermediate time period until the graphene layer is transferred to the functional layer stack.

In an embodiment of the method before removing the polymere support a release step is executed, e.g. at elevated temperature, with use of chemicals or with applied UV radiation. Here a two step process is applied, where the polymer is first released due to elevated temperature, chemicals or UV radiation and then removed by washing with appropriate chemicals, heating, or in a gas stream.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
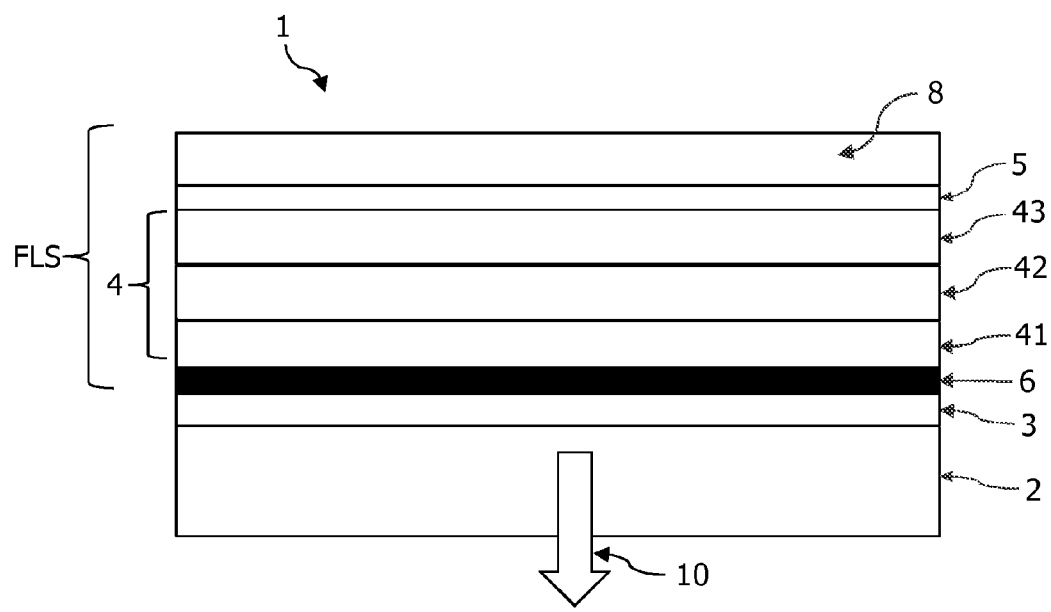
FIG. 1: an embodiment of a light emitting device as the organic electronic device with the graphene layer arranged between first electrode and an organic layer of the organic layer stack.

FIG. 1 shows an organic electronic device 1 arranged as an organic light emitting device 1 with a substrate 2, a first electrode 3 arranged directly on top of the substrate 2 and a functional layer stack FLS arranged on top of the first electrode 3 comprising an organic layer stack 4 with three organic layers 41, 42, 43 comprising a light emitting layer 42 and a second electrode 5 as well as an organic index matching layer 8 arranged on top of the second electrode 5 and one essentially transparent and electrically conductive graphene layer 6 on top of the first electrode 3 being in contact to the organic layer 41 within the organic layer stack 4. In this embodiment the graphene layer 6 acts as a diffusion barrier against diffusion of atoms, ions or molecules from the first electrode 3 into this organic layer 41, especially preventing the diffusion of In atoms or ions into the organic layer 41 in case of the first electrode 3 being the transparent anode made of ITO of a organic light emitting device 1 arranged as a bottom emitter (light emission through the substrate). The light emission through the substrate 2 is indicated by the arrow 10. The following functional layer stack is given as an example of one possible functional layer stack.

a p-doped layer, comprising a hole injection layer MTDATA:$F_4$-TCNQ (1%) with a thickness of 40 nm
a hole conducting layer of α-NPD 10 nm
a (first) emitting layer comprising a α-NPD:Ir(MDQ)$_2$(acac) (10%) with a thickness of 20 nm
an electrode transport layer (BAlq) with a thickness of 20 nm
a electron injection/n-doping layer of LiF
a cathode of Al with a thickness of 15 nm (top emitter) or 100 nm (bottom emitter)
an index matching layer of BAlq or α-NPD with a thickness of 60 nm)

Figure 2:
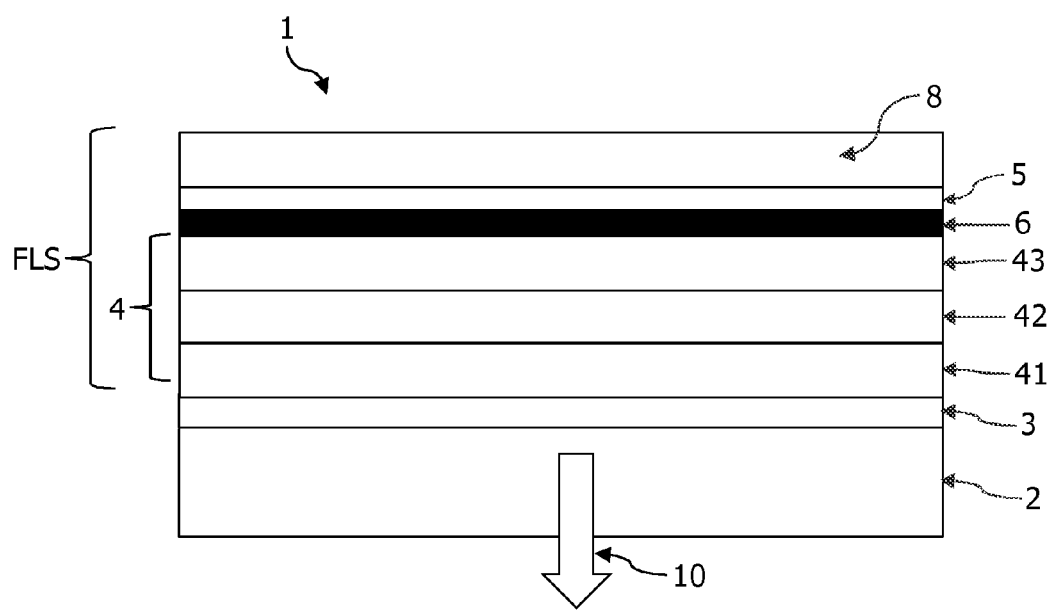
FIG. 2: another embodiment of the light emitting device as the organic electronic device with the graphene layer arranged between second electrode and an organic layer of the organic layer stack.

FIG. 2 shows an organic electronic device 1 arranged as an organic light emitting device 1 with a substrate 2, a first electrode 3 arranged directly on top of the substrate 2 and a functional layer stack FLS arranged on top of the first electrode 3 comprising an organic layer stack 4 with three organic layers 41, 42, 43 comprising a light emitting layer 42 and a second electrode 5 as well as an organic index matching layer 8 arranged on top of the second electrode 5 and one essentially transparent and electrically conductive graphene layer 6 between the second electrode 5 and the topmost organic layer 43 of the organic layer stack 4 being in contact to the organic layer 43. In this embodiment the graphene layer 6 acts as a diffusion barrier against diffusion of atoms, ions or molecules from the second electrode 5 into this organic layer 41, especially preventing the diffusion of metal atoms or ions such as Au, Ag, Al into the topmost organic layer 43 in case of the second electrode 5 being the reflective cathode of an organic light emitting device 1 arranged as a bottom emitter (light emission through the substrate). The light emission through the substrate 2 is indicated by the arrow 10.

Figure 3:
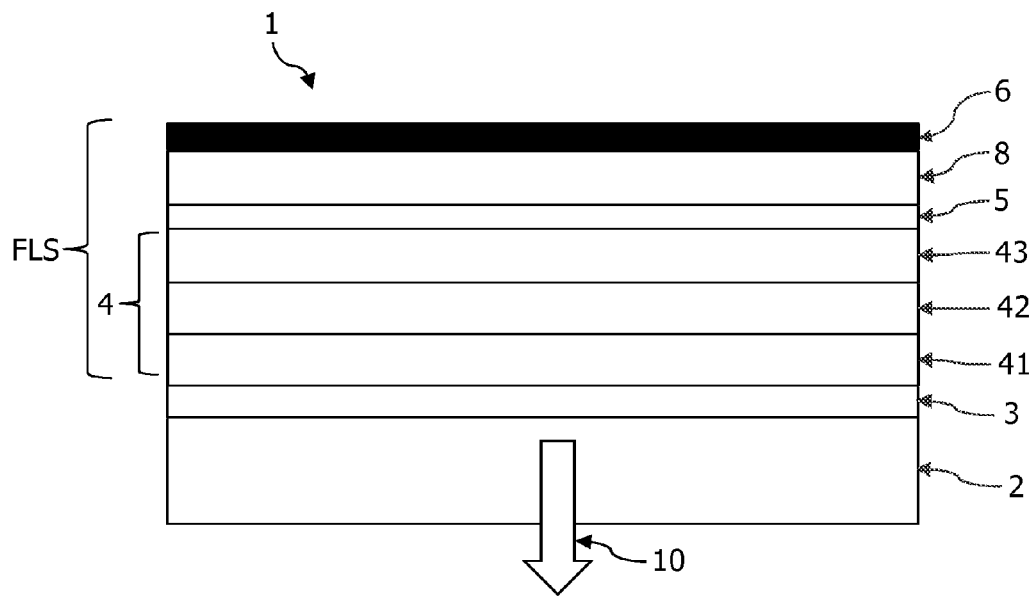
FIG. 3: another embodiment of the light emitting device as the organic electronic device with the graphene layer arranged on top of the organic index matching layer as the topmost organic layer within the functional layer stack.

FIG. 3 shows an organic electronic device 1 arranged as an organic light emitting device 1 with a substrate 2, a first electrode 3 arranged directly on top of the substrate 2 and a functional layer stack FLS arranged on top of the first electrode 3 comprising an organic layer stack 4 with three organic layers 41, 42, 43 comprising a light emitting layer 42 and a second electrode 5 as well as an organic index matching layer 8 arranged on top of the second electrode 5 and one essentially transparent and electrically conductive graphene layer 6 arranged on top of the index matching layer 8. The organic index matching layer 8 is used to adapt the optical properties of the functional layer stack such as refractive index and reflectivity in order to enhance the light out-coupling out of the OLED. In this embodiment the graphene layer 6 acts as a diffusion barrier against diffusion of atoms, ions or molecules from the environment into the functional layer stack FLS, especially preventing the diffusion of oxygen or moisture or other atoms, ions or molecules into the functional layer stack FLS not to harm the OLED performance over lifetime. The shown organic light emitting device 1 is arranged as a top- and/or bottom emitter (light emission through the second cathode and/or through the substrate). In case of a bottom emitter, the index matching layer 8 is not necessary. The light emission through the substrate 2 is indicated by the arrow 10.

The embodiments as shown in FIG. 1-3 are only examples of functional layer stacks within the scope of the invention. Other embodiments using a combination of two or more of the shown embodiments or other organic layer stacks as well as additional graphene layers arranged within the organic layer stack 4 might be chosen by skilled people within the scope of the present invention. The graphene layers 6 might be prepared by a catalyst-assisted chemical vapor deposition process using graphite as a starting material. Alternatively, the graphene layers 6 might be prepared from solution processing, where a graphene layer 6 is laminated on top of the particular organic layer 41, 42, 43 within the organic layer stack 4 or on top of the organic index matching layer 8, which shall be in contact with the graphene layer 6, or on top of the first electrode 3, if diffusion from the first electrode 3 into the organic layer stack 4 shall be prevented.

Figure 4:
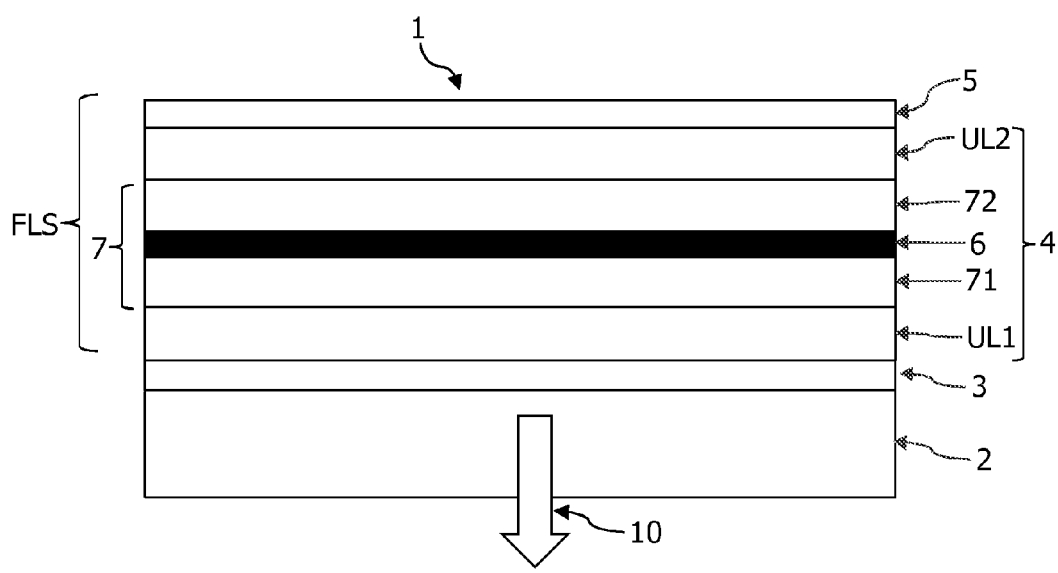
FIG. 4: another embodiment of a stacked organic light emitting device as the organic electronic device comprising two light emitting units separated by a charge generation layer stack comprising the graphene layer.

FIG. 4 shows another embodiment of a stacked organic light emitting device as the organic electronic device comprising a charge generation layer stack with the graphene layer arranged inside the charge generation layer stack. The organic layer stack 4 of the organic light emitting device 1 comprises two light emitting units UL1, UL2 between the first and second electrode 3, 5, wherein each light emitting unit UL1, UL2 comprises one unit layer stack with at least one organic light emitting layer 42, wherein the two of the light emitting units UL1, UL2 are separated from each other by a charge generation layer stack 7 consisting of an organic p-doped layer 71, an organic n-doped layer 72 and the graphene layer 6 arranged between the p-doped layer 71 and the n-doped layer 72. The n-doped layer 72 comprises an electron transport material suitable to provide an electron transport layer and a n-type dopant, where the ionization energy of the n-type dopant is lower than the electron affinity of the electron transport material. The n-doped system is Net18 doped with NDN26 from Novaled with a doping concentration of 10%. The thickness of the n-doped organic layer is 100 nm. The p-doped layer comprises a hole transport material (e.g. α-NPD or MTDATA) suitable to provide a hole transport layer and a p-type dopant, where the ionization energy of the hole transport material is lower than the electron affinity of the p-type dopant. The p-type dopant is NDP9 from Novaled (alternatively $F_4$-TCNQ or $MoO_3$ can be used). For a sufficient band bending of the p-doped organic layer at the interface to the n-doped organic layer, the thickness of the p-doped organic layer is 20 nm. The graphene layer 6 in between the p-type and n-type doped organic layers 71, 72 will strongly reduce or even prevent diffusion of n-type dopants into the p-type doped organic layer 71 and vice versa. This results in a stable charge generation process and therefore in a stable performance of the stacked OLED 1 over time. Furthermore due to the separation of p-type and n-type dopants, the depletion region at the interface between p-type and n-type doped organic layers 71, 72 will remain small leading to a low operation voltage, which remains stable at a low level over time.

As an example, for the other organic layers as well as for the electrodes in FIG. 4, the same materials as already mentioned for FIG. 1 can be used. The shown organic light emitting device 1 is arranged as a bottom emitter (light emission through the substrate). The light emission through the substrate 2 is indicated by the arrow 10, where the resulting light is a mixture of the light emitted from the light emitting layers of light emitting units UL1 and UL2.

Figure 5:
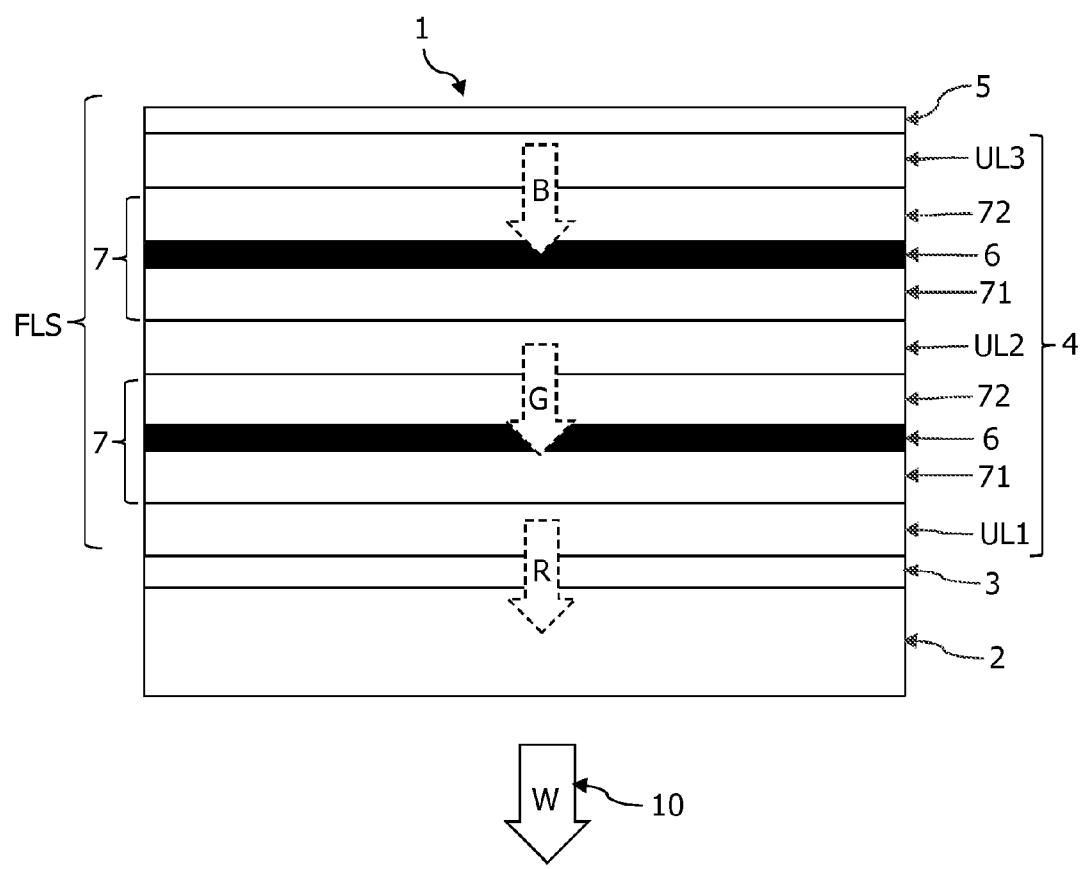
FIG. 5: another embodiment of another stacked organic emitting device as the organic electronic device comprising three light emitting units each separated by charge generation layer stacks comprising the graphene layer.

FIG. 5 shows another embodiment of the light emitting device 1 as the organic electronic device comprising two charge generation layer stacks 7 with the graphene layer 6 arranged inside the charge generation layer stack 7 separating three light emitting units UL1, UL2, UL3 from each other. In case of the first light emitting unit UL1 comprises an organic light emitting layer 42 emitting red light and the second light emitting unit UL2 comprises an organic light emitting layer 42 emitting green light and the third light emitting unit UL3 comprises an organic light emitting layer 42 emitting blue light, the light 13 emitted from the OLED is a mixture of red, green and blue light resulting in white light as an example. In other functional layer stacks, other light emitting layers, e.g. layers emitting red, yellow and blue light, can be used to provide white light. For the other organic layers as well as for the electrodes in FIG. 5, the same materials as already mentioned for FIG. 4 can be used.

Figure 6:
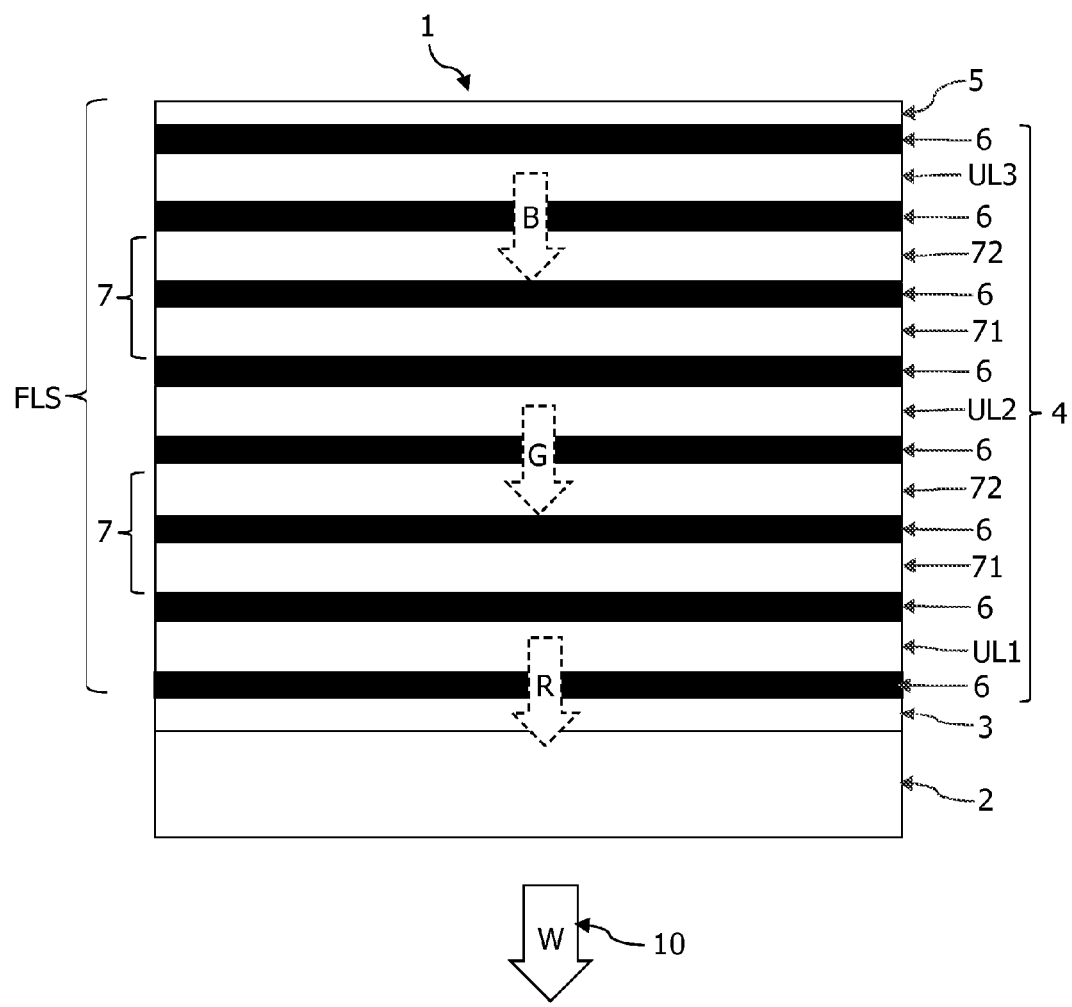
FIG. 6: another embodiment of the stacked organic light emitting device as shown in FIG. 5 comprising additional graphene layers between each adjacent organic layer.

FIG. 6 shows another embodiment of the stacked organic light emitting device 1 as shown in FIG. 5 comprising additional graphene layers 6 between each adjacent organic layer. Therefore graphene layers 6 are arranged on top of each organic layer 41, 42, 43, UL1, UL2, UL3 within the organic layer stack 4 (not explicitly shown for each layer within the light emitting units). In this functional layer stack FLS almost all diffusion from one organic layer or one electrode into another organic layer is prevented. Not to affect brightness and color rendering of the emitted white light 13, the transparencies and thicknesses of the graphene layers 6 are adapted suitably.

Figure 7:
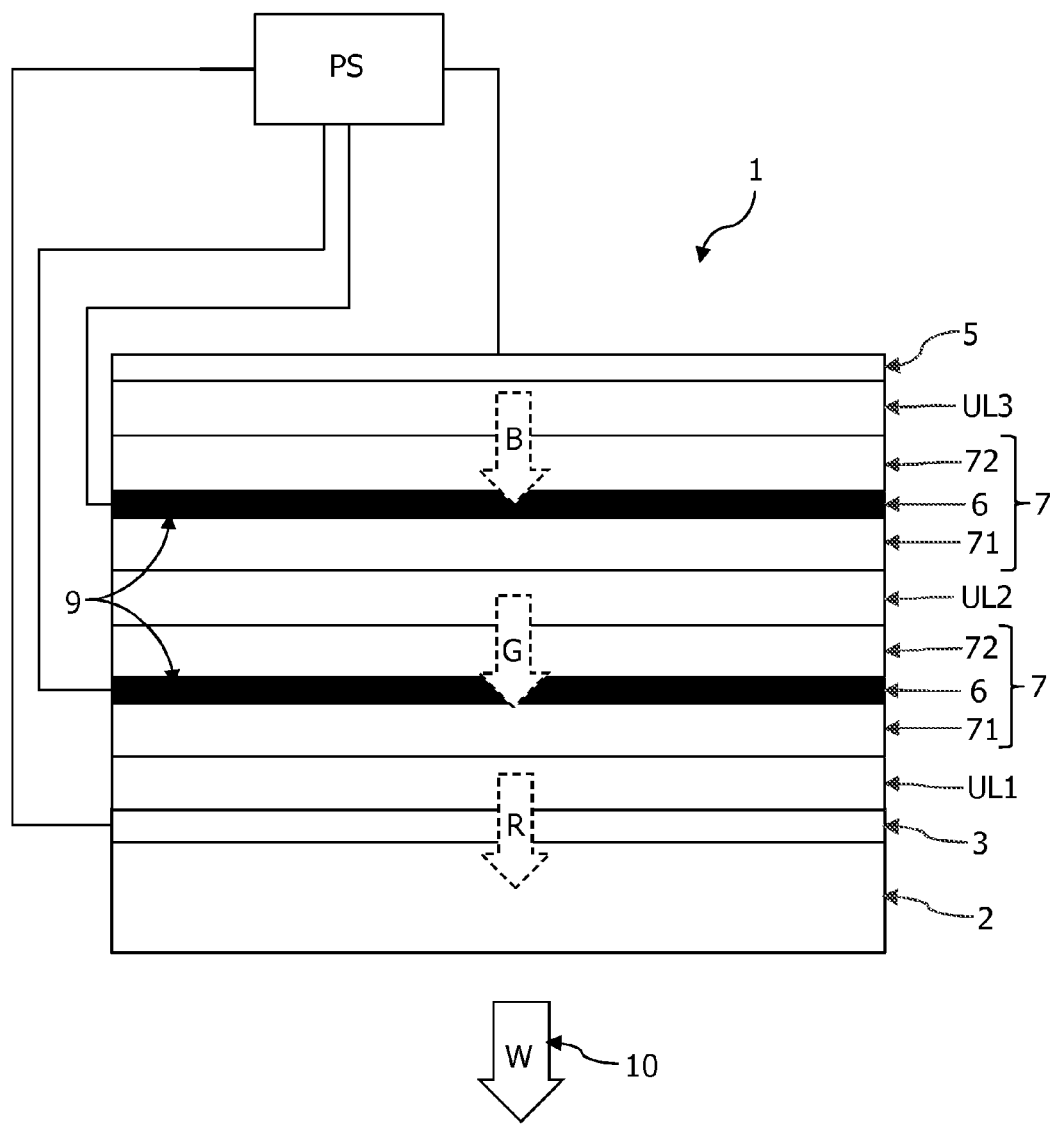
FIG. 7: another embodiment of the stacked organic light emitting device as shown in FIG. 5, where the graphene layers are connected to a power source in order to provide intermediate electrodes within the organic layer stack.

FIG. 7 shows another embodiment of the stacked organic light emitting device 1 as shown in FIG. 5, where the graphene layers 6 are connected to a power source PS in order to provide intermediate electrodes 9 within the organic layer stack 4. The intermediate electrodes 9 allow for applying bias voltages to the intermediate electrodes 9 to modify the light emission for each light emitting unit UL1, UL2, UL3 independently from each other. The operating voltage applied to the first and second electrodes 3, 5 control the light emission properties in general, while the bias voltages are used for fine tuning the desired light emission from each light emitting unit UL1, UL2, UL3. Skilled people know how to structure the functional layer stack FLS schematically shown in FIG. 7 in order to be able to contact the intermediate electrodes 9 within the functional layer stack. As an example, mask deposition can be used to provide suitable contact pads to apply an electrical connection between intermediate electrodes 9 and power source PS.

The graphene layer can be prepared by chemical vapor deposition (CVD) on catalytic metal surfaces such as Ni or Cu. The synthesis of a graphene monolayer or multilayer requires at least a carbon containing precursor gas such as methane ($CH_4$), a metal catalyst, and elevated temperatures of 400° C. to 1600° C. Graphene layers can be transferred by using polymer coatings such as polymethly methacrylate (PMMA) or polydimethylsiloxane (PDMS) as provisional rigid support, which prevents cracking and folding of graphene during the etching of the metal catalyst. By using catalytic metal foils the process can also be integrated in a roll-to-roll process. Graphene layers can be integrated at any position in the OLED layer stack by a transfer process of the graphene layer from the provisional polymer support to the target surface. The polymer is finally removed by a temperature release, evaporation of the polymer, chemical etching, chemical dissolving or plasma etching. It could also be used a two step process where the polymer is first released due to elevated temperature, chemicals or UV radiation and then removed by washing with appropriate chemicals, heating, or in a gas stream.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

LIST OF NUMERALS 1 organic electronic device, organic light emitting device
2 substrate
3 first electrode
4 organic layer stack
41, 43 organic layers with the organic layer stack
42 light emitting layer with the organic layer stack
5 second electrode
6 graphene layer
7 charge generation layer stack
71 p-doped layer within the charge generation layer stack
72 n-doped layer within the charge generation layer stack
8 index matching layer
9 intermediate electrode
10 light emitted by the OLED
FLS functional layer stack
PS power source
R,G,B red, green, blue light emitted from light emitting layers
W white light emitted from OLED
UL1, UL2, UL3 light emitting units (first, second, third)

The invention claimed is:

1. An organic light emitting device comprising:
a substrate;
a first electrode arranged over the substrate;
a functional layer stack configured to emit light and arranged over the first electrode, the functional layer stack comprising a plurality of organic layers; and
a second electrode disposed over said functional layer stack,
wherein the organic light emitting device further comprises at least one electrically conductive graphene layer that is arranged between at least two organic layers of said plurality of organic layers, is in contact with at least one organic layer of the at least two organic layers, and acts as a diffusion barrier against diffusion of atoms, ions or molecules into or from the at least one organic layer with which said graphene layer is in contact,
wherein the at least one graphene layer is essentially transparent at least to light emitted by the organic light emitting device.

2. The organic light emitting device as claimed in claim 1, wherein the functional layer stack comprises at least two light emitting units between the first and second electrode, wherein each light emitting unit of the at least two light emitting units comprises one unit layer stack with at least one organic light emitting layer, wherein the at least two light emitting units are separated from each other by a charge generation layer stack comprising an organic p-doped layer and an organic n-doped layer, wherein the graphene layer is located between the p-doped layer and the n-doped layer.

3. The organic light emitting device as claimed in claim 2, wherein the at least two light emitting units comprises three light emitting units that are between the first and second electrode, wherein a first light emitting unit and a second light emitting unit of the three light emitting units are separated from each other by the charge generation layer stack and wherein the second light emitting unit and a third light emitting unit of the three light emitting units are separated by a second charge generation stack.

4. The organic light emitting device as claimed in claim 2, wherein the n-doped layer comprises an electron transport material suitable to provide an electron transport layer and a n-type dopant, and wherein the ionization energy of the n-type dopant is lower or equal to the electron affinity of the electron transport material.

5. The organic light emitting device as claimed in claim 4, wherein the p-doped layer comprises a hole transport material suitable to provide a hole transport layer and a p-type dopant, and wherein the ionization energy of the hole transport material is lower or equal to the electron affinity of the p-type dopant.

6. The organic light emitting device as claimed in claim 5, wherein the graphene layer provides an intermediate electrode within the functional layer stack in addition to the first and second electrode also for connection to a power source.

7. The organic light emitting device as claimed in claim 6, wherein the composition and thickness of the graphene layer are arranged to be transparent to visible light.

8. The organic light emitting device as claimed in claim 7, wherein the graphene layer is established by multiple single layers of sp2 bonded carbon arranged in a two dimensional crystal with a total layer thickness below 5 nm.

9. The organic light emitting device as claimed in claim 8, wherein the graphene layer is a single layer of sp2 bonded carbon arranged in a two dimensional crystal.

10. The organic light emitting device as claimed in claim 9, wherein the graphene layer is a first graphene layer of a plurality of graphene layers, and wherein a respective one of said plurality of graphene layers is disposed over each organic layer within the functional layer stack.

11. A method for manufacturing an organic light emitting device comprising:
introducing a graphene layer into a functional layer stack by transferring the graphene layer from a provisional polymer support to the surface of one of the layers within the functional layer stack followed by the step of removing the polymer support with a suitable removing process, wherein the organic light emitting device comprises a substrate, a first electrode arranged over the substrate, the functional layer stack, the functional layer stack being configured to emit light and arranged over the first electrode, the functional layer stack comprising a plurality of organic layers, and a second electrode disposed over said functional layer stack, wherein the organic light emitting device further comprises at least one electrically conductive graphene layer that is arranged between at least two organic layers of said plurality of organic layers, is in contact with at least one organic layer of the at least two organic layers, and acts as a diffusion barrier against diffusion of atoms, ions or molecules into or from the at least one organic layer with which said graphene layer is in contact, wherein the at least one graphene layer is essentially transparent at least to light emitted by the organic light emitting device.

12. The method as claimed in claim 11, further comprising a release step at elevated temperature, the release step using one of chemicals or UV radiation, wherein the release step is executed before removing the polymer support.

13. An organic light emitting device comprising:
a substrate;
a first electrode arranged over the substrate;
a functional layer stack arranged over the first electrode, the functional layer stack comprising at least two light emitting units; and
a second electrode,
wherein the organic light emitting device further comprises at least one essentially transparent and electrically conductive graphene layer that is arranged between said at least two light-emitting units, and acts as a diffusion barrier against diffusion of atoms, ions or molecules.

14. The organic light emitting device as claimed in claim 13, wherein at least a first light emitting unit of said at least two light emitting units includes at least a first organic light emitting layer that is configured to emit light of a different color than at least a second organic light emitting layer of at least a second light-emitting unit of said at least two light-emitting units.

* * * * *